(12) United States Patent
Alptekin et al.

(10) Patent No.: US 8,796,099 B2
(45) Date of Patent: Aug. 5, 2014

(54) INDUCING CHANNEL STRAIN VIA ENCAPSULATED SILICIDE FORMATION

(71) Applicant: International Business Machines Corporation, Armonk, NY (US)

(72) Inventors: Emre Alptekin, Wappingers Falls, NY (US); Ahmet S. Ozcan, Pleasantville, NY (US); Viraj Y. Sardesai, Poughkeepsie, NY (US); Cung D. Tran, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/705,242

(22) Filed: Dec. 5, 2012

(65) Prior Publication Data

US 2014/0154856 A1     Jun. 5, 2014

(51) Int. Cl.
*H01L 21/336* (2006.01)
(52) U.S. Cl.
USPC ........... 438/299; 438/586; 438/592; 438/595; 438/660; 438/669
(58) Field of Classification Search
None
See application file for complete search history.

(56) References Cited

U.S. PATENT DOCUMENTS 6,054,768 A * 4/2000 Givens et al. ................. 257/753
6,329,276 B1 * 12/2001 Ku et al. ....................... 438/586
7,504,336 B2 * 3/2009 Purtell et al. ................. 438/682
2009/0017586 A1   1/2009 Fang et al.
2010/0320509 A1 * 12/2010 Knorr et al. .................. 257/288

OTHER PUBLICATIONS

Reader et al., Transition metal silicides in silicon technology, Rep. Prog. Phys. 56 (1992) 1397-1467. Printed in the UK.*
Howard et al., Stress in Silicon due to the Formation of Self Aligned Poly-CoSi2 Lines Studied by Micro-Raman Spectroscopy, Mat. Res. Soc. Symp. Proc. vol. 402, 1996.*

* cited by examiner

*Primary Examiner* — Charles Garber
*Assistant Examiner* — Syed Gheyas
(74) *Attorney, Agent, or Firm* — Kevin Anderson; Yuanmin Cai

(57) ABSTRACT

Methods of forming semiconductor structures having channel regions strained by encapsulated silicide formation. Embodiments include forming a transistor, depositing an interlevel dielectric (ILD) layer above the transistor, forming contact recesses exposing portions of source/drain regions of the transistor, forming metal-rich silicide layers on the exposed portions of the source/drain regions, forming metal contacts in the contact recesses above the metal-rich silicide layers, and converting the metal-rich silicide layer to a silicon-rich silicide layer. In other embodiments, the metal-rich silicide layers are formed on the source/drain regions prior to ILD layer deposition. Embodiments further include forming a transistor, depositing an ILD layer above the transistor, forming contact recesses exposing portions of source/drain regions of the transistor, forming metal liners in the contact recesses, forming metal fills in the contact recesses, and forming silicide layers on the source/drain regions by reacting portions of the metal liners with portions of the source/drain regions.

16 Claims, 8 Drawing Sheets

INDUCING CHANNEL STRAIN VIA ENCAPSULATED SILICIDE FORMATION

BACKGROUND

The present invention relates generally to the fabrication of semiconductor devices, and more specifically to inducing channel stress in field effect transistors (FETs).

FETs may include a semiconductor substrate containing a source region and a drain region spaced apart by a channel region. A FET with n-type source region and drain region is referred to as an nFET. A FET with p-type source region and drain region is referred to as a pFET. The channel region may be undoped or have opposite doping than the source region and the drain region. A gate electrode may be formed above the channel region. By applying voltage to the gate electrode, the conductivity of the channel region may increase and allow current to flow from the source region to the drain region. The amount by which the channel conductivity increases depends in part upon carrier mobility in the channel region (i.e., how quickly a electron or hole can move through the channel region).

As metal-oxide-semiconductor field-effect transistor (MOSFET) structures continue to become smaller in size, carrier mobility in the channel region may also be reduced due to increased dopant concentration in the MOSFET. One method of increasing carrier mobility in the channel region is to apply tensile strain or compressive strain to the channel region. However, known methods of applying strain to the channel region often require the addition of processes into standard process flows, potentially increasing the cost of producing transistors while also decreasing yield. It may therefore be advantageous to employ techniques that increase carrier mobility in the channel region of a transistor by generating stress or strain in the channel and therefore increasing device performance without requiring a substantial number of additional processes.

BRIEF SUMMARY

The present invention relates to methods of forming semiconductor structures including field-effect transistors having channel regions strained by forming encapsulated silicide layers on the source/drain regions of the transistor. According to at least one exemplary embodiment, methods may include forming a transistor structure including a gate on a semiconductor substrate, a channel region below the gate, and a source/drain region in the semiconductor substrate adjacent to the channel region. An interlevel dielectric layer may then be deposited above the transistor structure. The interlevel dielectric layer may then be etched to form a contact recess region exposing a portion of the source/drain region. A metal-rich silicide layer my then be formed on the exposed portion of the source/drain region. A metal contact may them be formed in the contact recess region, resulting in encapsulation of the metal-rich silicide layer. The metal-rich silicide layer may then be converted into a silicon-rich silicide layer to apply strain to the channel region.

According to another embodiment of the invention, methods may include forming a transistor structure including a gate on a semiconductor substrate, a channel region below the gate, and a source/drain region in the semiconductor substrate adjacent to the channel region. A metal-rich silicide layer may then be formed on at least a portion of a top surface of the source/drain region. A interlevel dielectric layer may then be deposited above the transistor structure. The interlevel dielectric layer may then be etched to form a contact recess exposing a portion of the metal-rich silicide layer A metal contact may them be formed in the contact recess region, resulting in encapsulation of the metal-rich silicide layer. The metal-rich silicide layer may then be converted into a silicon-rich silicide layer to apply strain to the channel region.

According to another embodiment of the invention, methods may include forming a transistor structure including a gate on a semiconductor substrate, a channel region in the semiconductor substrate below the gate, and a source/drain region in the semiconductor substrate adjacent to the channel region and depositing a interlevel dielectric layer above the transistor structure. The interlevel dielectric layer may then be etched to form a contact recess region exposing a portion of the source/drain region. A metal liner may then be formed in the contact recess region on the exposed portion of the source/drain region. A metal fill may then be formed in the contact recess region. A silicide layer may then be formed on the source/drain region by reacting a portion of the metal liner with a portion of the source/drain region.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1A:
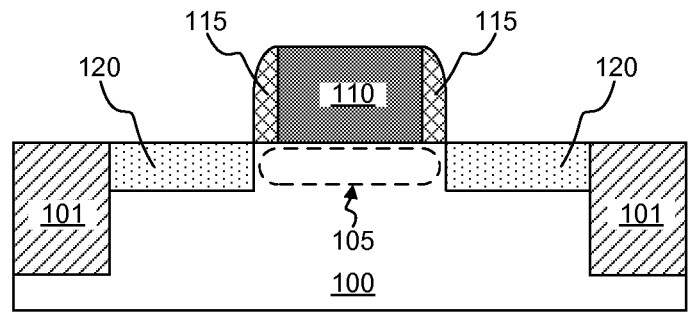
FIG. 1A depicts forming a transistor structure, according to an embodiment of the present invention.

Referring to FIG. 1A, a transistor structure may be formed by any methods known in the art. It will be understood that the depicted transistor structure is merely an exemplary structure, and that embodiments of the present invention may include a broad range of transistor structures. The transistor structure may include a semiconductor substrate 100, a gate 110 formed on the semiconductor substrate 100, spacers 115 formed on sidewalls of the gate 110, and source/drain regions 120 formed in the semiconductor substrate 100. The substrate 100 may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Substrate 100 may further include isolation regions 101 to isolate the depicted transistor structure from adjacent structures (not shown). Isolation regions 101 may be formed by any known method in the art, including, for example, etching into the substrate 100 to form trenches, and then filling the trenches with an insulating material, such as silicon dioxide. Other embodiments may include other means of isolating structures formed on the substrate 100, or may have isolation around only some of, or none of, the structures.

The gate 110 may include a gate dielectric layer, a gate electrode, and a hard cap (not shown), and may be formed by any known method in the art, including both gate-first and gate-last processes, such as depositing a stack of layers on the substrate 100, masking the stack of layers using photolithography, and etching to remove unwanted material from the stack of layers (not shown). The placement of gate 110 above substrate 100 may define a channel region 105 in substrate 100 below the gate 110. After formation of the gate 110, spacers 115 may be formed on the sidewalls of the gate 110. Spacers 115 may be made of materials including, but not limited to, silicon nitride, silicon oxide, silicon carbide and may be approximately 2 nm to approximately 100 nm thick, preferably approximately 2 nm to approximately 50 nm. Spacers 115 may be formed, for example, by depositing a silicon nitride layer over gate 110 and then removing excess material using an anisotropic reactive ion etching process, such as RIE (not shown). Due to the etching process, spacers 115 may have a curved top surface on its edge opposite gate 110.

Source/drain regions 120 may be formed in the substrate 100 adjacent to channel region 105 by any known methods in the art, including doping the substrate 100 via ion implantation. In other embodiments, source/drain regions 120 may be formed by etching recess regions in substrate 100 and then filling the recess regions with semiconductor material, such as silicon-germanium or silicon-carbon, via known deposition or growth methods (not shown). In some embodiments, raised source/drain techniques may be incorporated such that source/drain regions 120 extend above the top surface of the substrate 100.

Figure 1B:
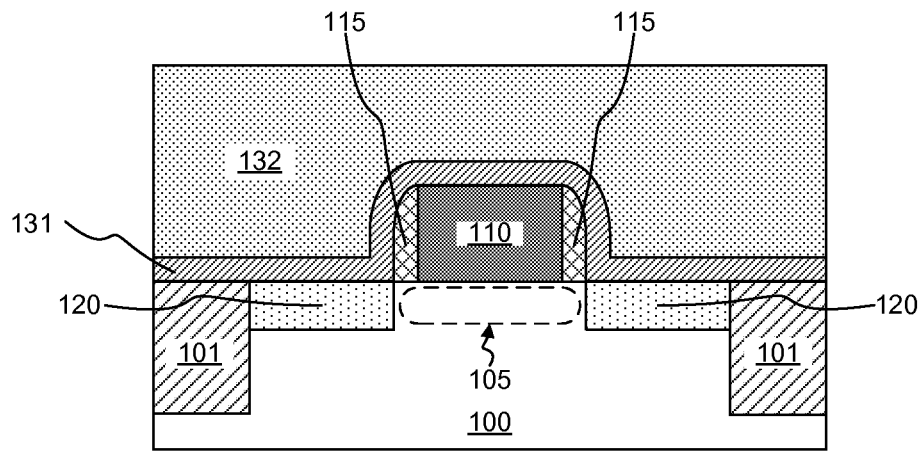
FIG. 1B depicts depositing a stress liner and an inter-level dielectric (ILD) layer above the structure of FIG. 1A, according to an embodiment of the present invention.

Referring to FIG. 1B, a stress liner 131 and an inter-level dielectric (ILD) layer 132 may be deposited above the structure of FIG. 1A. The stress liner 131 may be formed by depositing, using any known technique, including chemical vapor deposition and physical vapor deposition, a silicon nitride layer above the structure of FIG. 1A. The stress liner 131 may have a thickness of approximately 5 nm to approximately 50 nm. In some embodiments, the stress liner 131 may not be present or may consist of more than one layer. The ILD layer 132 may be formed by depositing, using any known technique, including chemical vapor deposition and physical vapor deposition, an insulating layer above the stress liner 131, and then planarizing the deposited layer using, for example, chemical-mechanical planarization (CMP). The ILD layer 132 may be made of, for example, oxides, nitrides, oxynitrides, or some combination thereof, and may have a thickness of approximately 5 nm to approximately 200 nm. In some embodiments, the ILD layer 132 may consist of more than one layer.

Figure 1C:
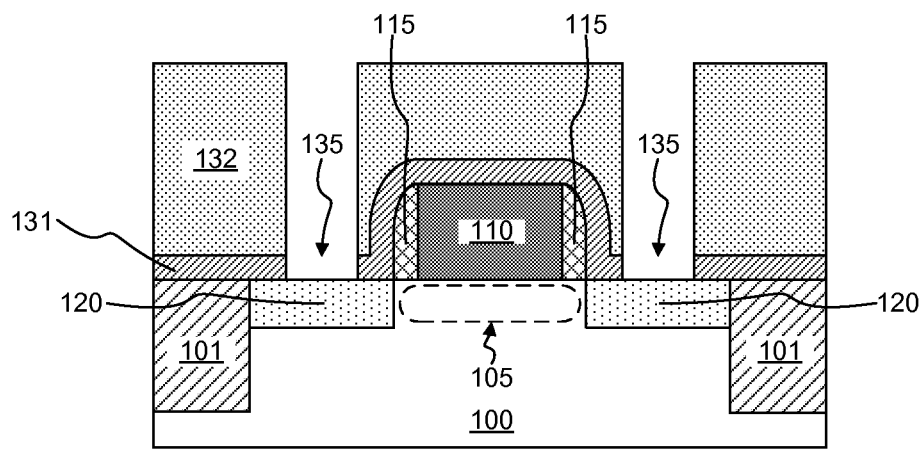
FIG. 1C depicts etching the stress liner and ILD layer of FIG. 1B to form contact recess regions exposing a portion of source/drain regions of FIG. 1B, according to an embodiment of the present invention.

Referring to FIG. 1C, the stress liner 131 and the ILD layer 132 may be etched to form contact recess regions 135. The stress liner 131 and the ILD layer 132 may be etched using any known etching technology, including, for example, reactive ion etching (RIE) or plasma etching. Contact recess regions 135 may expose portions of source/drain regions 120 and may have a horizontal width of approximately 5 nm to approximately 30 nm. In some embodiments, the sidewalls of the contact recess regions 135 may not be fully vertical, either by intentional design choice or due to limitations of the etching process used. Contact recess regions 135 may therefore have a tapered shape (not shown), narrowing as contact recess regions 135 approach the top surface of source/drain regions 120.

Figure 1D:
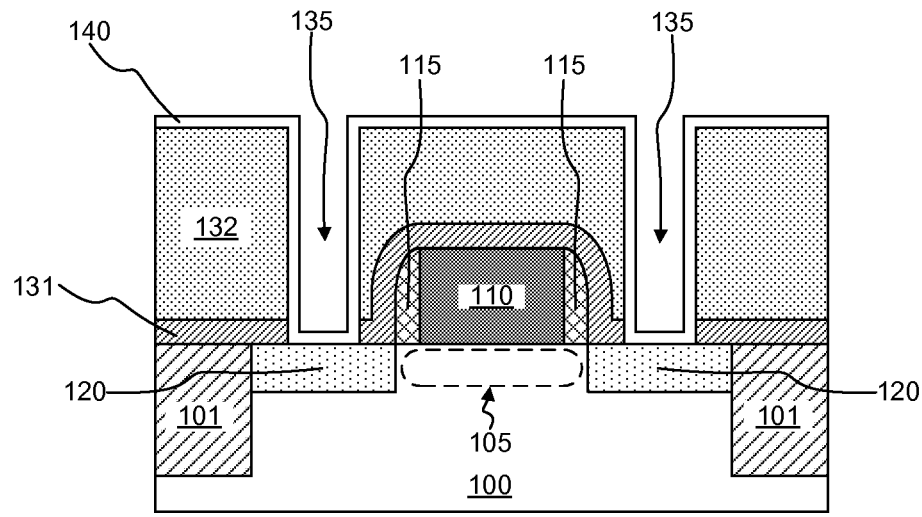
FIG. 1D depicts depositing a metal layer in the contact recess regions of the FIG. 1C, according to an embodiment of the present invention.
Figure 1E:
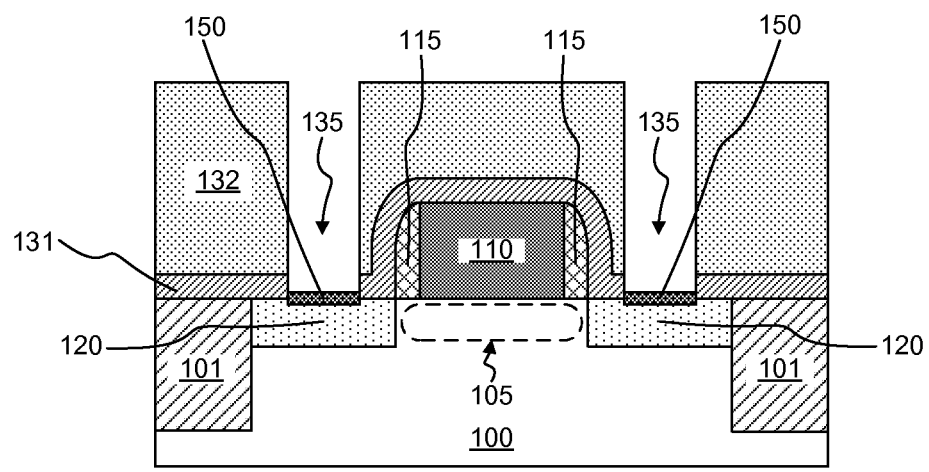
FIG. 1E depicts forming metal-rich silicide layers on top portions of the source/drain regions of FIG. 1D, according to an embodiment of the present invention.

Referring to FIG. 1D, a metal layer 140 may be deposited in contact recess regions 135, so that portions of the metal layer 140 cover portions of source/drain regions 120. The metal layer 140 may be deposited by any thin film deposition technique available in the industry including, but not limited to, physical vapor deposition (i.e. sputter deposition), chemical vapor deposition or evaporation. In embodiments where the transistor structure formed in FIG. 1A is an n-channel FET (nFET), metal layer 140 may comprise, for example, cobalt or nickel, so that intrinsic tensile stress is applied to channel region 105 when metal layer 140 is partially converted to a silicide layer (FIG. 1E). Other embodiments may include other metals capable of forming silicide layers, where the conversion from a metal-rich silicide to a silicon-rich silicide (e.g. $Ni_2Si$ to NiSi, discussed below in conjunction with FIG. 1G) results in a net volume loss. In embodiments where the transistor structure formed in FIG. 1A is an p-channel FET (pFET), metal layer 140 may comprise palladium, so that intrinsic compressive stress is applied to channel region 105 when metal layer 140 is partially converted to a silicide layer (FIG. 1E). Other embodiments may include other metals capable of forming silicide layers, where the conversion from a metal-rich silicide to a silicon-rich silicide results in a net volume increase.

Referring to FIG. 1E, metal-rich silicide layers 150 may be formed at least partially on top surfaces of source/drain regions 120. Metal-rich silicide layers 150 may be formed using any known silicidation technique, including, for example, annealing the structure of FIG. 1D to react the metal layer 140 (FIG. 1D) with the underlying source/drain regions 120 and then removing any unreacted portions of the metal layer 140. The annealing process may be performed by a rapid thermal annealing (RTA) process at peak temperatures ranging from approximately 300 to approximately 900 degrees Celsius, depending on the material composition of metal layer 140.

Figure 1F:
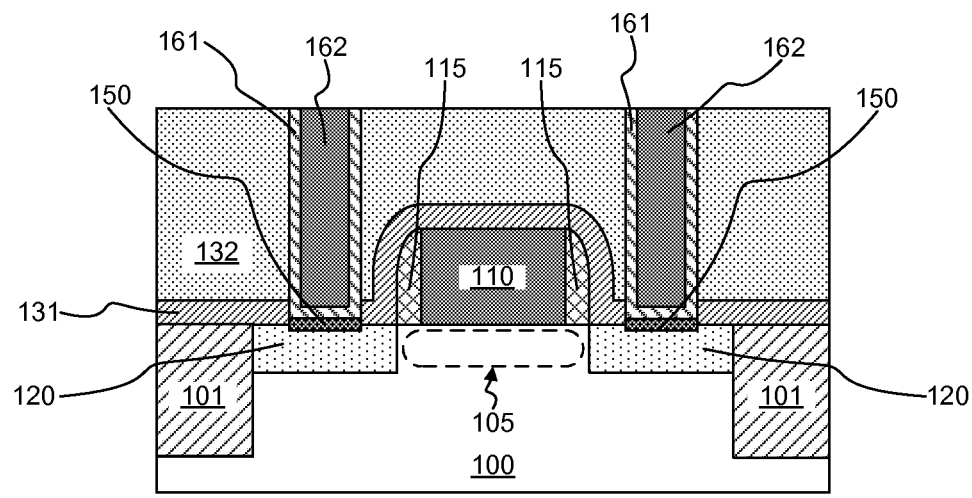
FIG. 1F depicts filling the contact recess regions of FIG. 1D with a contact liner and a contact fill, according to an embodiment of the present invention.

Referring to FIG. 1F, contact recess regions 135 (FIG. 1E) may be filled with metal liners 161 and a metal fills 162 to form metal contacts electrically connected to source/drain regions 120 through metal-rich silicide layers 150. Metal liners may be made of, for example, titanium, titanium nitride, tantalum or tantalum nitride, and may include one or more layers of liner material and may be formed by any known deposition technique. Metal fills 162 may include, for example, copper, aluminum, or tungsten, and may be formed using a filing technique such as electroplating, electroless plating, chemical vapor deposition, physical vapor deposition or a combination of methods. Once metal contacts are formed in contact recess regions 135, metal-rich silicide layers 150 may be encapsulated and may not freely expand in any direction.

Figure 1G:
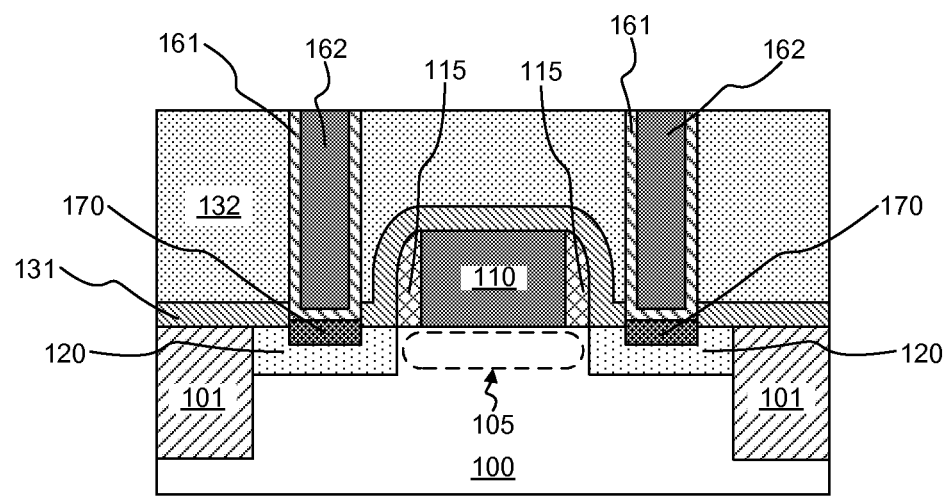
FIG. 1G depicts forming silicon-rich silicide layers on top portions of the source/drain regions of FIG. 1F, according to an embodiment of the present invention.

Referring to FIG. 1G, metal-rich silicide layers 150 (FIG. 1F) may be converted into silicon-rich silicide layers 170 by, for example, a second annealing process. The annealing process may be performed by a rapid thermal annealing (RTA) process at peak temperatures ranging from approximately 300 degrees to approximately 900 degrees Celsius, depending on the material composition of metal-rich silicide layers 150.

By forming metal liners 161 and a metal fills 162 in contact recess regions 135 (FIG. 1E) prior to forming silicon-rich silicide layers 170, the conversion process may be constrained so that the volumetric contraction or expansion that may occur when metal-rich silicide layers 150 convert into silicon-rich silicide layers 170 may cause silicon-rich silicide layers 170 to pull or push (i.e. apply tensile or compressive strain) on the surrounding structure, including channel region 105 of substrate 100. By applying tensile or compressive strain on channel region 105, carrier mobility may increase in the channel region 105, leading to increased device performance and decreased power consumption. Additionally, by forming liners 161 and a metal fills 162 prior to forming silicon-rich silicide layers 170, the need to later form openings exposing silicon-rich silicide layers 170 may be eliminated, resulting in silicon-rich silicide layers 170 remaining encapsulated. Because exposing silicon-rich silicide layers 170 may result in relaxation of the generated strain, forming liners 161 and a metal fills 162 prior to forming silicon-rich silicide layers 170 may further increase the strain benefits by reducing relaxation.

Figure 2A:
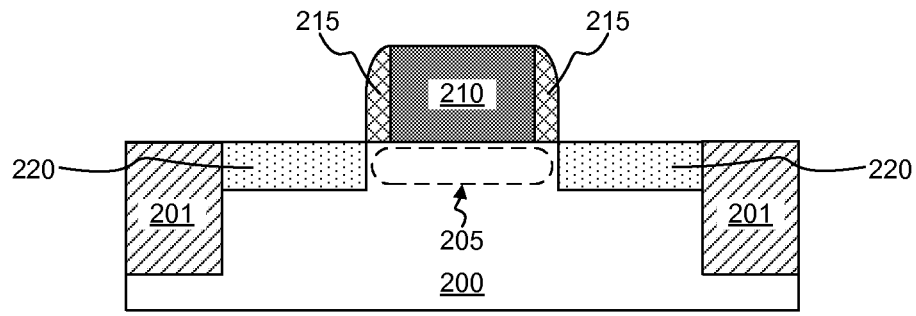
FIG. 2A depicts forming a transistor structure, according to an embodiment of the present invention.

FIGS. 2A-2G depict another embodiment of the present invention following a similar process flow to the embodiment depicted in FIGS. 1A-1G where the formation of the metal-rich silicide layers precedes the deposition of the stress liner and ILD layer. Referring to FIG. 2A, a transistor structure may be formed by any methods known in the art. It will be understood that the depicted transistor structure is merely an exemplary structure, and that embodiments of the present invention may include a broad range of transistor structures. The transistor structure may include a semiconductor substrate 200, a gate 210 formed on the semiconductor substrate 200, spacers 215 formed on sidewalls of the gate 210, and source/drain regions 220 formed in the semiconductor substrate 200. The substrate 200 may be by the same processes and made of the same materials as the substrate 100 (FIG. 1A), and may include isolation structures 201, which may be by the same processes and made of the same materials as isolation structures 101. Similarly, gate 210, spacers 215, and source/drain regions 220 may be by the same processes and made of the same materials as gate 110, spacers 115, and source/drain regions 120, respectively. The placement of gate 210 above substrate 200 may define a channel region 205 in substrate 200 below the gate 210.

Figure 2B:
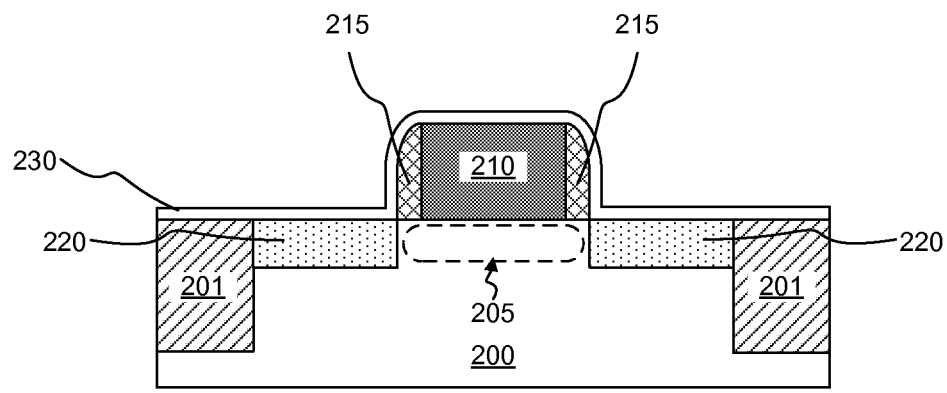
FIG. 2B depicts depositing a metal layer above the transistor structure of FIG. 2A, according to an embodiment of the present invention.

Referring to FIG. 2B, a metal layer 230 may be deposited above the structure of FIG. 2A, so that portions of the metal layer 230 cover at least portions of source/drain regions 220. The metal layer 230 may be deposited by any thin film deposition technique available in the industry including, but not limited to, physical vapor deposition (i.e. sputter deposition), chemical vapor deposition or evaporation. The metal layer 230 may be made of the same materials as metal layer 140, so that tensile or compressive stress may be applied to the channel region 205 as desired.

Figure 2C:
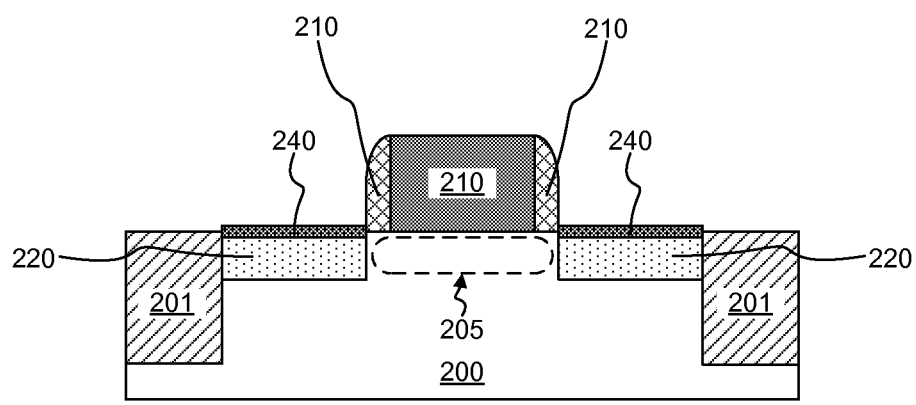
FIG. 2C depicts forming metal-rich silicide layers on top portions of the source/drain regions of the structure of FIG. 2B, according to an embodiment of the present invention.

Referring to FIG. 2C, metal-rich silicide layers 240 may be formed at least partially on top surfaces of source/drain regions 120. Metal-rich silicide layers 240 may be formed any known silicidation technique, including, for example, annealing the structure of FIG. 1D to react the metal layer 230 (FIG. 1D) with the underlying source/drain regions 220 and then removing any unreacted portions of the metal layer 230. The annealing process may be performed by a rapid thermal annealing (RTA) process at peak temperatures ranging from approximately 300 degrees to approximately 900 degrees Celsius, depending on the material composition of metal layer 230.

Figure 2D:
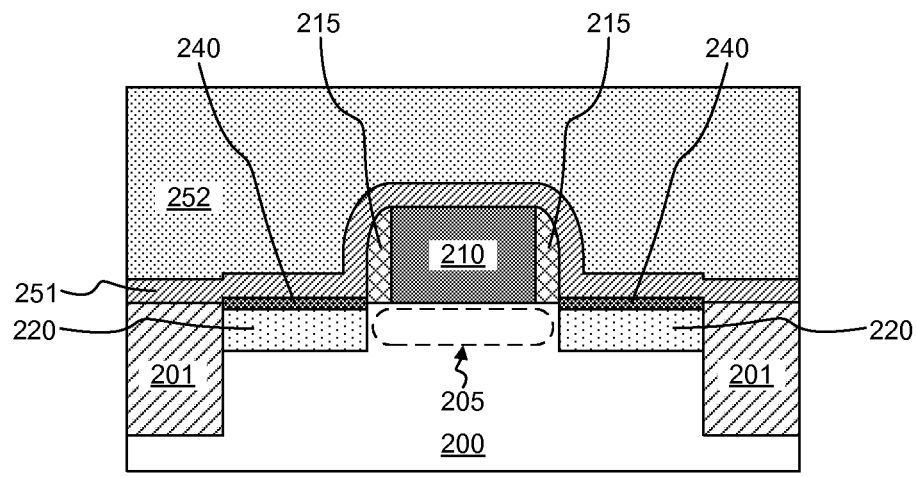
FIG. 2D depicts depositing a stress liner and an inter-level dielectric (ILD) layer above the structure of FIG. 2C, according to an embodiment of the present invention.

Referring to FIG. 2D, a stress liner 251 and an ILD layer 252 may be deposited above the structure of FIG. 2C. The stress liner 251 and the ILD layer 252 may be made of the same materials and by the same processes as the stress liner 131 and the ILD layer 132.

Figure 2E:
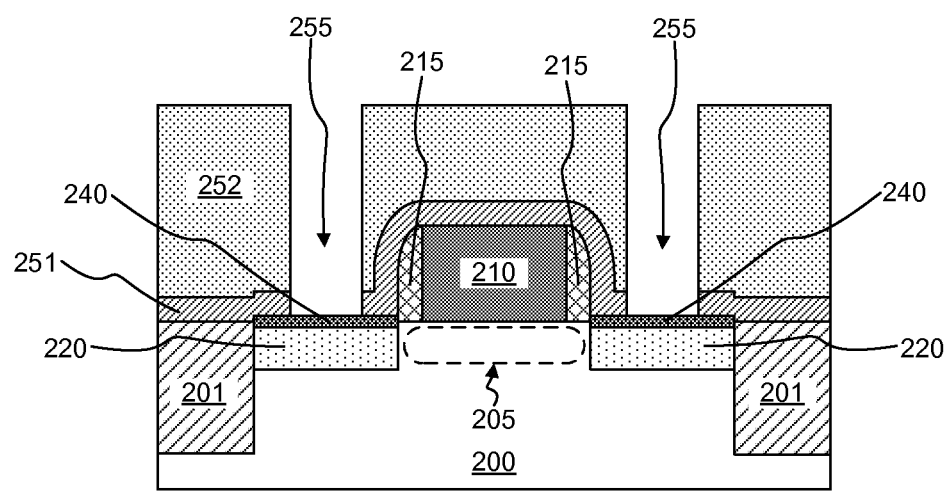
FIG. 2E depicts etching the stress liner and ILD layer of FIG. 2D to form contact recess regions exposing a portion of source/drain regions of FIG. 2D, according to an embodiment of the present invention.

Referring to FIG. 2E, the stress liner 251 and the ILD layer 252 may be etched to form contact recess regions 255. The stress liner 251 and the ILD layer 252 may be etched using any known etching technology, including, for example, reactive ion etching (RIE) or plasma etching. Contact recess regions 255 may expose portions of metal-rich silicide layers 240 and may have a horizontal width of approximately 5 nm to approximately 50 nm. In some embodiments, the sidewalls of the contact recess regions 255 may not be fully vertical, either by intentional design choice or due to limitations of the etching process used. Contact recess regions 255 may therefore have a tapered shape (not shown), narrowing as contact recess regions 255 approach the top surfaces of source/drain regions 220.

Figure 2F:
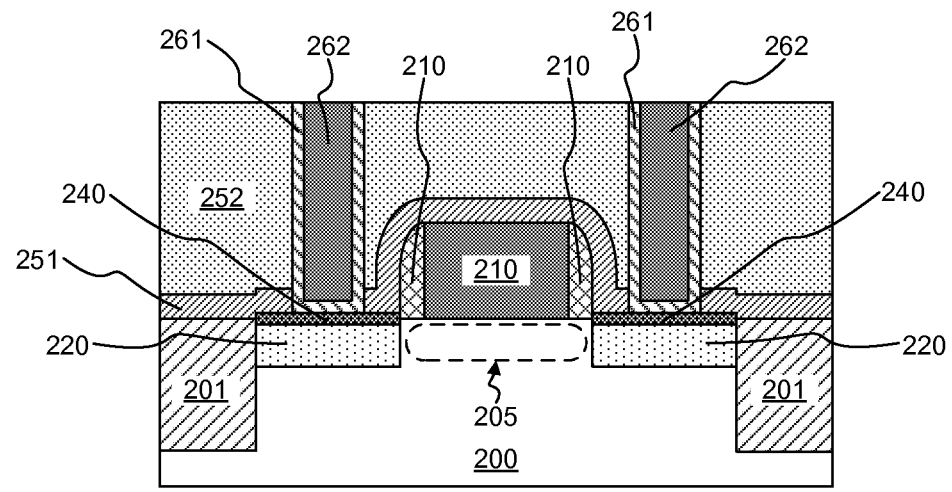
FIG. 2F depicts filling the contact recess regions of FIG. 2E with a contact liner and a contact fill, according to an embodiment of the present invention.

Referring to FIG. 2F, contact recess regions 255 (FIG. 2E) may be filled with metal liners 261 and a metal fills 262 to form metal contacts electrically connected to source/drain regions 220 through metal-rich silicide layers 240. Metal liners 261 and a metal fills 262 may be by the same processes and made of the same materials as metal liners 261 and metal fills 262, respectively.

Figure 2G:
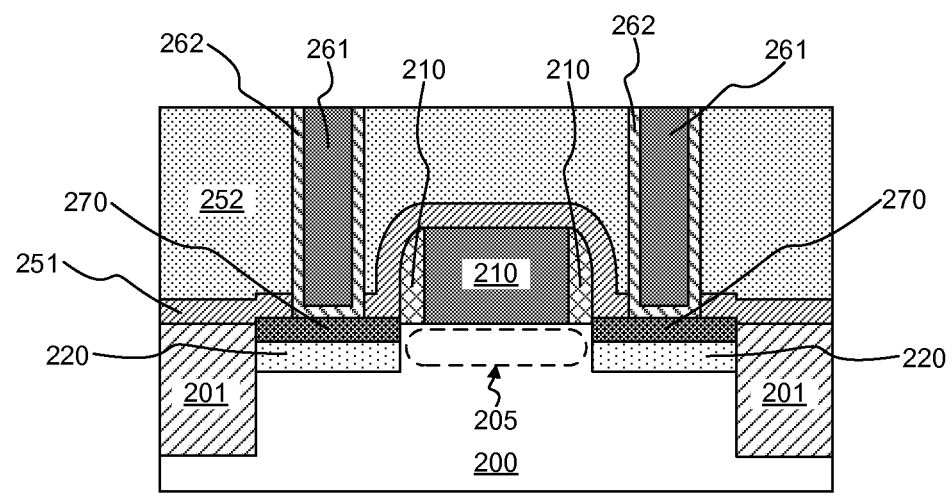
FIG. 2G depicts forming silicon-rich silicide layers on top portions of the source/drain regions of FIG. 2F, according to an embodiment of the present invention.

Referring to FIG. 2G, metal-rich silicide layers 240 may be converted into silicon-rich silicide layers 270 by, for example, a second annealing process. The annealing process may be performed by a rapid thermal annealing (RTA) process at peak temperatures ranging from approximately 300 Celsius to approximately 900 degrees Celsius, depending on the material composition of metal-rich silicide layers 240.

By forming metal-rich silicide layers 240 (FIG. 2C) prior to the formation the stress liner 251 and the ILD layer 252 (FIG. 2D), rather than after the formation of contact recess regions 255, as in the embodiment depicted in FIGS. 1A-1G, a greater total volume of metal-rich silicide may be formed, potentially resulting in a greater amount of strain when the metal-rich silicide is converted into silicon-rich silicide. Further, forming metal-rich silicide layers 240 prior to the formation of the stress liner 251 and the ILD layer 252 may better incorporated in certain process flows, as determined by a person of ordinary skill in the art. Further, maximizing the silicide contact area (i.e., the area of metal-rich silicide layers 240 may improve parasitic resistance and minimize contact stud length to reduce parasitic capacitance.

Figure 3A:
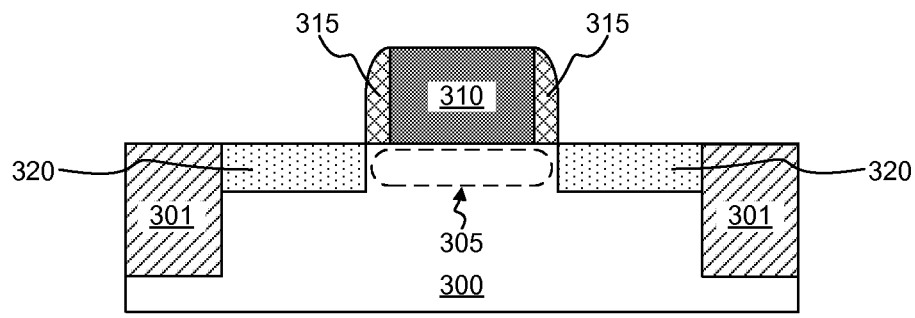
FIG. 3A depicts forming a transistor structure, according to an embodiment of the present invention.

FIGS. 3A-3E depict another embodiment following a similar process flow to the embodiment depicted in FIGS. 1A-1G where a portion of the metal liner of the contact is used to form the silicide layer. Referring to FIG. 3A, a transistor structure may be formed by any methods known in the art. It will be understood that the depicted transistor structure is merely an exemplary structure, and that embodiments of the present invention may include a broad range of transistor structures. The transistor structure may include a semiconductor substrate 300, a gate 310 formed on the semiconductor substrate 300, spacers 315 formed on sidewalls of the gate 310, and source/drain regions 320 formed in the semiconductor substrate 300. The substrate 300 may be by the same processes and made of the same materials as the substrate 300 (FIG. 1A), and may include isolation structures 301, may be by the same processes and made of the same materials as isolation structures 301. Similarly, gate 310, spacers 315, and source/drain regions 320 may be by the same processes and made of the same materials as gate 310, spacers 315, and source/drain regions 320, respectively. The placement of gate 310 above substrate 300 may define a channel region 305 in substrate 300 below the gate 310.

Figure 3B:
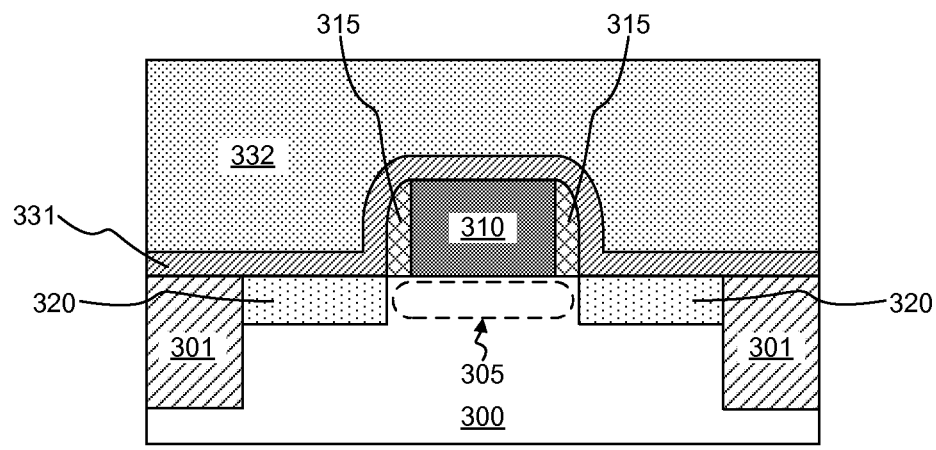
FIG. 3B depicts depositing a stress liner and an inter-level dielectric (ILD) layer above the structure of FIG. 3A, according to an embodiment of the present invention.

Referring to FIG. 3B a stress liner 331 and an ILD layer 332 may be deposited above the structure of FIG. 3A. The stress liner 331 and the ILD layer 332 may be made of the same materials and by the same processes as the stress liner 131 and the ILD layer 132.

Figure 3C:
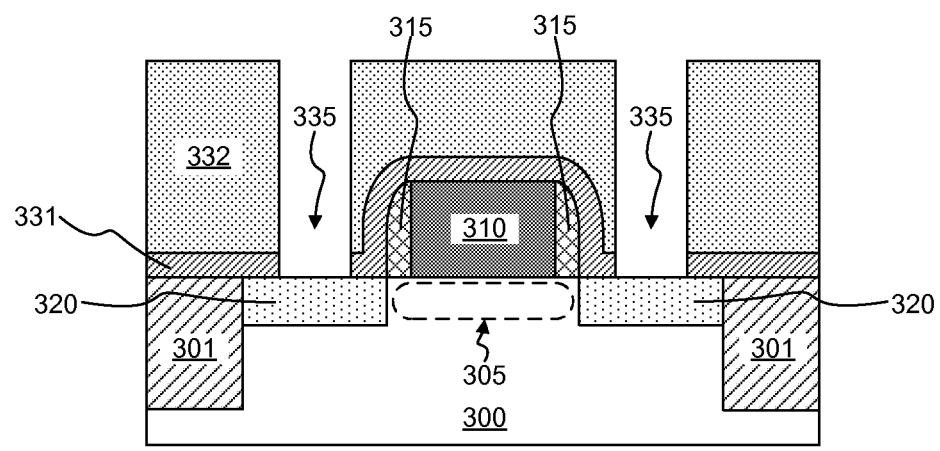
FIG. 3C depicts etching the stress liner and ILD layer of FIG. 3B to form contact recess regions exposing a portion of source/drain regions of FIG. 3B, according to an embodiment of the present invention.

Referring to FIG. 3C, the stress liner 331 and the ILD layer 332 may be etched to form contact recess regions 335. The stress liner 331 and the ILD layer 332 may be etched using any known etching technology, including, for example, reactive ion etching (RIE) or plasma etching. Contact recess regions 335 may expose portions of source/drain regions 320 and may have a horizontal width of approximately 5 nm to approximately 50 nm. In some embodiments, the sidewalls of the contact recess regions 335 may not be fully vertical, either by intentional design choice or due to limitations of the etching process used. Contact recess regions 335 may therefore have a tapered shape (not shown), narrowing as contact recess regions 335 approach the top surfaces of source/drain regions 320.

Figure 3D:
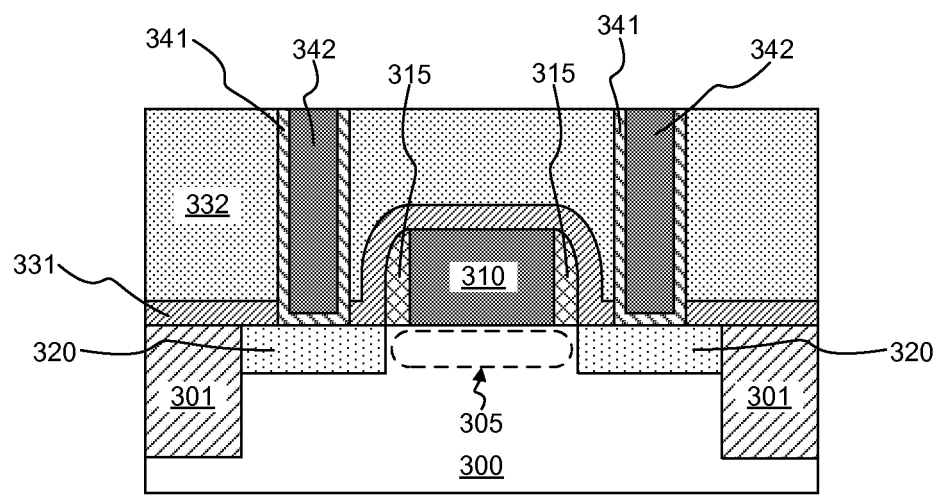
FIG. 3D depicts filling the contact recess regions of FIG. 3C with a contact liner and a contact fill, according to an embodiment of the present invention.

Referring to FIG. 3D, contact recess regions 335 (FIG. 2E) may be filled with metal liners 341 and a metal fills 342 to form metal contacts electrically connected to source/drain regions 320. Metal fills 342 may be by the same processes and made of the same materials as metal fills 162. Metal liners 341 may be made of titanium, tantalum, nickel, platinum, palladium, erbium, ytterbium, or any other metal capable of serving as a liner material and forming a silicide.

Figure 3E:
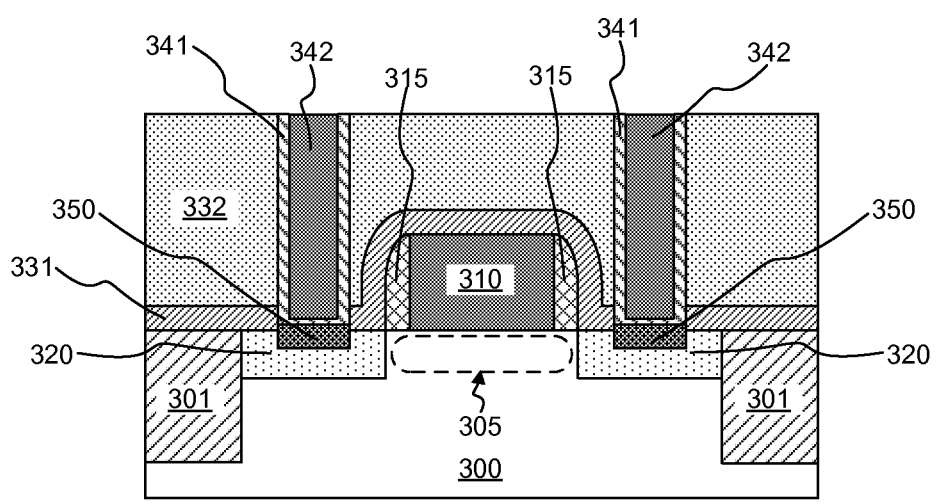
FIG. 3E depicts forming metal-rich silicide layers on top portions of the source/drain regions of the structure of FIG. 3D, according to an embodiment of the present invention.

Referring to FIG. 3E, silicide layers 350 may be formed at least partially on top surfaces of source/drain regions 320 by, for example, annealing the structure of FIG. 3D to react portions of metal liners 341 with portions of source/drain regions 320. The annealing process may be performed by a rapid thermal annealing (RTA) process at peak temperatures ranging from approximately 300 Celsius to approximately 900 degrees Celsius, depending on the material composition of metal liners 341 and source/drain regions 320. Because metal liners 341 and source/drain regions 320 are encapsulated by metal fills 342, the silicidation process is constrained and may apply compressive or tensile stress to the channel region 305 of the substrate 300. In some embodiments, a second annealing process (not shown) may be performed in order to convert silicide layers 350 to silicon-rich silicide and apply further tensile stress to the channel region 305.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
   forming a transistor structure including a gate on a semiconductor substrate, a channel region in the semiconductor substrate below the gate, and a source/drain region in the semiconductor substrate adjacent to the channel region;
   depositing an interlevel dielectric layer above the transistor structure;
   etching the interlevel dielectric layer to form a contact recess, wherein the contact recess exposes a portion of the source/drain region;
   forming a metal-rich silicide layer on the exposed portion of the source/drain region;
   forming a metal contact in the contact recess region, wherein the metal-rich silicide layer is encapsulated by the formed metal contact; and
   converting the metal-rich silicide layer to a silicon-rich silicide layer, wherein the silicon-rich silicide layer applies tensile or compressive stress to the channel region, wherein the silicon-rich silicide layer remains encapsulated by the metal contact after converting the metal-rich silicide layer to a silicon-rich silicide layer.

2. The method of claim 1, wherein forming the metal-rich silicide layer on the exposed portion of the source/drain region comprises:
   depositing a metal layer on the exposed portion of the source/drain region in the contact recess;
   annealing the transistor structure to react a portion of the metal layer with a portion of the source/drain region; and
   removing any unreacted portions of the metal layer.

3. The method of claim 1, wherein the transistor structure comprises an nFET and converting the metal-rich silicide layer to a silicon-rich silicide layer results in a net volume loss.

4. The method of claim 1, wherein the transistor structure comprises an pFET and converting the metal-rich silicide layer to a silicon-rich silicide layer results in a net volume increase.

5. The method of claim 1, wherein converting the metal-rich silicide layer to a silicon-rich silicide layer comprises thermally annealing the transistor structure.

6. The method of claim 1, further comprising the metal contact continuing to encapsulate the metal contact after converting the metal-rich silicide layer to a silicon-rich silicide layer to prevent relaxation of the tensile or compressive stress applied to the channel region.

7. A method of forming a semiconductor structure, the method comprising:
    forming a transistor structure including a gate on a semiconductor substrate, a channel region in the semiconductor substrate below the gate, and a source/drain region in the semiconductor substrate adjacent to the channel region;
    forming a metal-rich silicide layer on at least a portion of a top surface of the source/drain region;
    depositing a interlevel dielectric layer above the transistor structure;
    etching the interlevel dielectric layer form a contact recess, wherein the contact recess exposes a portion of the metal-rich silicide layer;
    forming a metal contact in the contact recess region, wherein the metal-rich silicide layer is encapsulated by the formation of the metal contact; and
    converting the metal-rich silicide layer to a silicon-rich silicide layer, wherein silicon-rich silicide layer applies tensile or compressive stress to the channel region, wherein the silicon-rich silicide layer remains encapsulated by the metal contact after converting the metal-rich silicide layer to a silicon-rich silicide layer.

8. The method of claim 7, wherein forming a metal-rich silicide layer on at least a portion of the top surface of the source/drain region:
    depositing a metal layer on the portion of the source/drain;
    annealing the transistor structure to react a portion of the metal layer with the portion of the source/drain region; and
    removing any unreacted portions of the metal layer.

9. The method of claim 7, wherein the transistor structure comprises an nFET and converting the metal-rich silicide layer to a silicon-rich silicide layer results in a net volume loss.

10. The method of claim 7, wherein the transistor structure comprises an pFET and converting the metal-rich silicide layer to a silicon-rich silicide layer results in a net volume increase.

11. The method of claim 7, wherein converting the metal-rich silicide layer to a silicon-rich silicide layer comprises thermally annealing the transistor structure.

12. A method of forming a semiconductor structure, the method comprising:
    forming a transistor structure including a gate on a semiconductor substrate, a channel region in the semiconductor substrate below the gate, and a source/drain region in the semiconductor substrate adjacent to the channel region;
    depositing a interlevel dielectric layer above the transistor structure;
    etching the interlevel dielectric layer form a contact recess, wherein the contact recess exposes a portion of the source/drain region;
    forming a metal liner in the contact recess region, wherein the metal liner is on the exposed portion of the source/drain region;
    forming a metal fill in the contact recess region wherein the metal fill encapsulates the metal liner and the exposed portion of the source/drain region; and
    forming a silicide layer on the source/drain region by reacting a portion of the metal liner with a portion of the source/drain region, wherein the silicide layer is encapsulated by the metal fill after reacting a portion of the metal liner with a portion of the source/drain region.

13. The method of claim 12, further comprising annealing the transistor structure to convert the silicide layer to a silicon-rich silicide layer.

14. The method of claim 12, wherein the transistor structure comprises an nFET and converting the metal-rich silicide layer to a silicon-rich silicide layer results in a net volume loss.

15. The method of claim 12, wherein the transistor structure comprises an pFET and converting the metal-rich silicide layer to a silicon-rich silicide layer results in a net volume increase.

16. The method of claim 12, wherein the silicide layer is encapsulated after reacting a portion of the metal liner with a portion of the source/drain region to prevent relaxation of a tensile or compressive stress applied to the channel region by the silicide layer.

* * * * *